United States Patent [19]

Huang et al.

[11] Patent Number: 5,262,610
[45] Date of Patent: Nov. 16, 1993

[54] LOW PARTICULATE RELIABILITY ENHANCED REMOTE MICROWAVE PLASMA DISCHARGE DEVICE

[75] Inventors: Steve S. Huang, Richardson; Cecil J. Davis, Greenville; Rhett B. Jucha, Celeste; Lee M. Loewenstein, Plano, all of Tex.

[73] Assignee: The United States of America as represented by the Air Force, Washington, D.C.

[21] Appl. No.: 677,048

[22] Filed: Mar. 29, 1991

[51] Int. Cl.$^5$ ................................. B23K 9/00
[52] U.S. Cl. .................... 219/121.43; 219/121.4; 156/646; 156/345; 204/298.31; 204/298.36
[58] Field of Search .............. 219/121.43, 121.44, 219/10.55 A, 10.55 R; 204/298.36, 298.37, 298.31, 298.17; 156/345

[56] References Cited

U.S. PATENT DOCUMENTS

| | | | |
|---|---|---|---|
| 4,004,122 | 1/1977 | Hallier | 219/10.55 A |
| 4,423,303 | 12/1983 | Hirose et al. | 219/121.43 |
| 4,474,625 | 10/1984 | Cohen et al. | 219/10.55 A |
| 4,851,630 | 7/1989 | Smith | 219/10.55 A |
| 4,889,965 | 12/1989 | Gervais et al. | 219/10.55 A |
| 4,908,492 | 3/1990 | Okamoto et al. | 219/121.52 |

Primary Examiner—Mark H. Paschall
Attorney, Agent, or Firm—Irwin P. Garfinkle; Donald J. Singer

[57] ABSTRACT

A remote microwave plasma generator comprises the combination of two parts, a tunable microwave applicator, and a double wall, water cooled quartz/sapphire tube. The tunable waveguide applicator is a nonconducting adjustable waveguide short with a quartz/sapphire tube inserted through it. The adjustable end is one quarter of a guide wavelength from the center line of the tube, and the other side is 0.1 inches less in distance, thus permitting the applicator to be used with a triple stub tuner for optimum coupling.

3 Claims, 1 Drawing Sheet

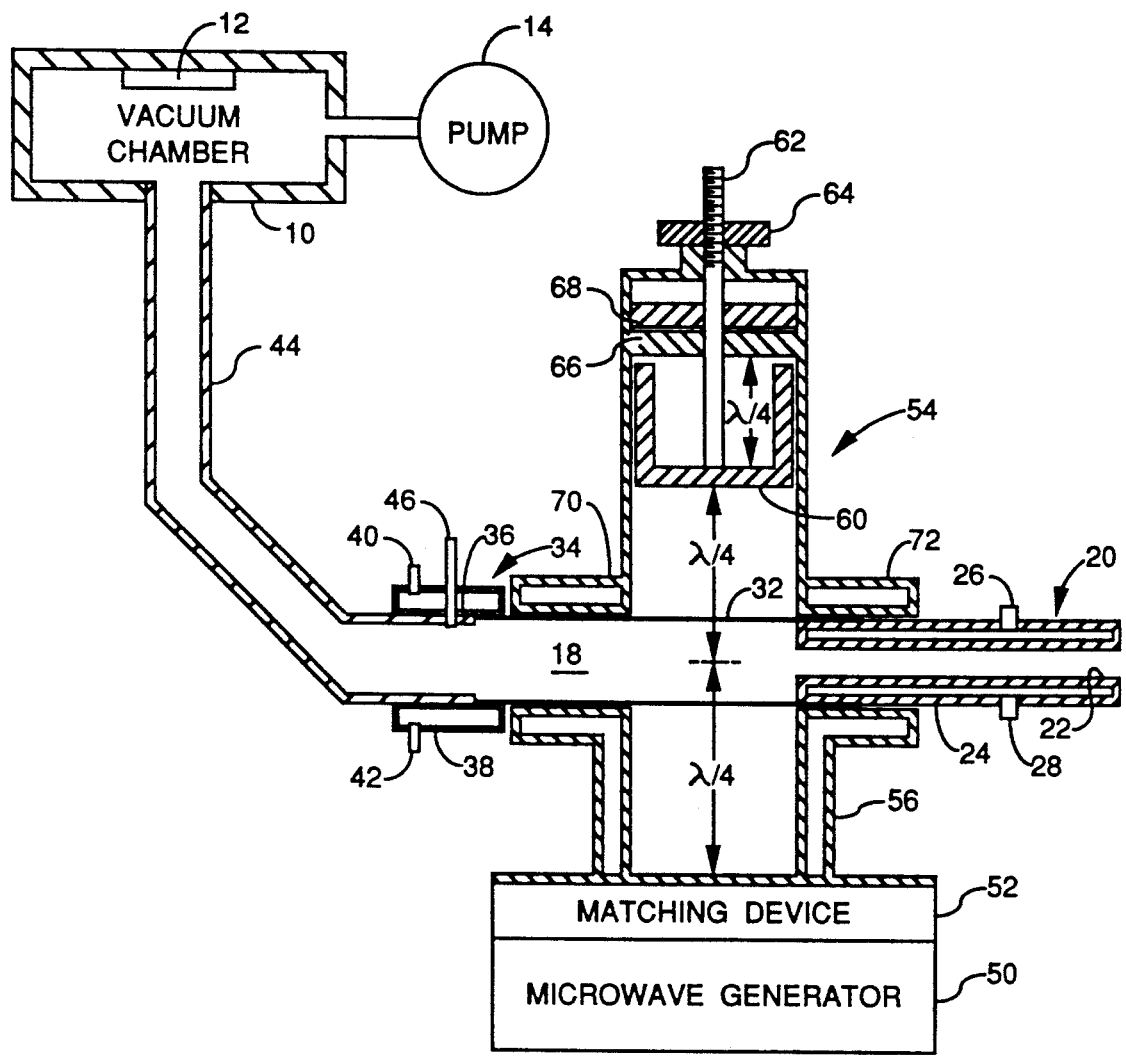

LOW PARTICULATE RELIABILITY ENHANCED REMOTE MICROWAVE PLASMA DISCHARGE DEVICE

STATEMENT OF GOVERNMENT INTEREST

The invention described herein may be manufactured and used by or for the Government for governmental purposes without the payment of any royalty thereon.

BACKGROUND OF THE INVENTION

The present invention relates to a method and apparatus for microwave etching and deposition. The invention provides for the use of remote microwave injection into the chamber housing the article being processed. One known method for such processing is referred to as gas reactive ion etching (RIE). In accordance with such process, the article to be etched and a reaction gas are brought into contact with each other to etch the article. This invention relates to the microwave generating components and the reactant gas conduits utilized in such processes.

Microwave discharge has found increasing application as an excitation source for the production of free radicals in gaseous electronics studies. It produces a high degree of ionization and a large amount of molecular dissociation without undue heating of the background gas. It also has no need for internal electrodes, thus making it possible to construct reaction vessels which are simpler, free from contamination, and less subject to damage.

The purpose of a discharge cavity as used in accordance with this invention is to transfer power from a microwave source to a reactant gas, which is conducted through a quartz tube to a vacuum chamber. A resonant structure is used to increase the electric field in the gas. In order to match the impedance of this resonant structure to the waveguide of the microwave power supply, some sort of coupling device (such as a triple stub tuner) is used. When the impedance is matched, the power reflected from the microwave application is minimized. This is desirable since a decrease in the reflected power indicates an increase in efficiency of the applicator. Since the properties of the discharge change with pressure and with the particular reactant gas, it is necessary to provide both tuning and matching adjustments to obtain efficient operation over a wide range of discharge condition.

SUMMARY OF THE INVENTION

In brief, the present invention comprises the combination of two parts, a tunable microwave applicator, and a double wall, water cooled quartz/sapphire tube. The tunable waveguide applicator is a nonconducting adjustable waveguide short with leakage preventive means on either side of the broad wall, permitting a quartz/sapphire tube to be inserted through the adjustable waveguide short. The adjustable end is one quarter of a guide wavelength from the center line of the tube, and the other side is 0.1 inches less in distance. This permits the applicator to be used with a triple stub tuner for optimum coupling.

OBJECTS OF THE INVENTION

It is an object of this invention to provide a tunable microwave applicator in combination with a double wall, water cooled, quartz/sapphire tube for supplying a plasma to an article to be processed in a vacuum chamber.

Another object of this invention is to provide a waveguide applicator which is a non-conducting adjustable waveguide short with leakage preventive means on either side of the broad wall, and permitting a quartz/sapphire tube to be inserted through the adjustable waveguide short.

Still another object of this invention is to provide a tunable microwave applicator which uses an adjustable short circuit to obtain optimum coupling for the reactant gas discharge.

Still another object of the invention is to provide a reactant gas tubing which includes sapphire components to prevent chemical reaction with the reactive species of the activated gas, further improving particulate reduction in the reactor.

DESCRIPTION OF THE DRAWING

For further objects of this invention, reference should now be made to the single figure of the drawing in which a preferred embodiment is diagrammatically shown.

DESCRIPTION OF A PREFERRED EMBODIMENT

Referring to the single figure of the drawing, there is shown an etching (or deposition) system which includes a vacuum chamber 10 in which a wafer 12 is to be processed. A vacuum pump 14 is used to reduce the pressure in the chamber 10 to the desired level for the particular application. While not shown, the wafer 12 may be heated or otherwise energized, for example with RF energy.

The reactant gas is supplied from a gas source (not shown) through a composite sapphire and quartz conduit 18 comprised of several sections. The inlet section comprises a double wall quartz inlet tube 20 having an inner wall 22 and a spaced outer wall 24. Cooling water is supplied to the space between the walls 22 and 24 through a water inlet 26, and exits through a water outlet 28. The center section of the conduit 18 comprises a sapphire tube 32 which is glued to the inlet tube 20. The third section of the conduit 18 is another double wall quartz tube 34 which is glued to the sapphire tube 32. The quartz tube 34 has an inner wall 36, a spaced outer wall 38 with a water inlet 40, and water outlet 42. The last section of the tube 20 is a quartz tube 44 which supplies the plasma to the vacuum chamber 10. A gas bypass vent 46, positioned at the inlet to the tube 44 extends through the double walled quartz tube 34.

To generate a plasma, microwave energy is applied to the reactant gases flowing through the conduit 18. The microwave energy is supplied from a pulsed microwave generator 50 through a matching device 52, which may be a triple stub tuner, for coupling the microwave energy to a tunable microwave applicator, generally indicated at 54.

The microwave applicator 54 is circular in cross section and it comprises a nonconducting adjustable waveguide short having one end coupled to the matching device 52 by means of a water cooled jacket 56. The other end of the circular waveguide 54 includes a cup-shaped plunger 60 adjustably supported from a rod 62. The axial position of the plunger 60 is established by an adjustment nut 64. The plunger 60 is provided with a non conducting closure 66 adjustably spaced ¼ wavelength from the bottom of the cup-shaped plunger. A disc 68 of lossy material is fixedly positioned above the closure 66.

The water cooled jacket 56 is provided with an aperture through which the conduit 18 is inserted. The double wall 56 has cylindrical extensions 70 and 72 which provide cooling for the sapphire tube 32.

Nitrogen is purged into the applicator through an inlet 70 in order to cool the inner side of the cavity, and preventing ozone being generated. The circular waveguide has double wall water cooling on the applicator in order to cool the high temperature quartz/sapphire tube, due to gas discharged, through the tube. The tubing is made by combining a quartz tube and a sapphire tube together. The sapphire part of this tube is located inside the applicator in order to prevent the chemical reaction from the reactive species of the activated gas—such as fluorine—to react with the wall material. The quartz part is located outside of the applicator and has a double meter-band shape inside the reactor.

The adjustable short circuits are used to provide a variable reactance in waveguide systems. The normalized input impedance is given as:

$$\frac{Z_{in}}{Z_o} = \overline{Z}_{in} = j\overline{X}_{in} = j\tan\frac{2\pi x}{\lambda_g} \quad (1)$$

where
$Z_{in}$ is input impedance
$Z_o$ is characteristic impedance of the waveguide
$\overline{X}_{in}$ is imaginary part of the normalized input impedance The impedance transformation equation for the lossless waveguide is:

$$Z_{in} = Z_o \frac{Z_L + jZ_o\tan\beta d}{Z_o + jZ_L\tan\beta d} \quad (2)$$

where $\beta d$ is a propagation constant without attenuation and $Z_o$ is the characteristic impedance of the waveguide. Any value of $\overline{X}_{in}$ can be realized by proper adjustment of the short position x. For example, letting $X=\lambda_g/4$ results in an infinite input reactance, which represents open circuit. The variation of input reactance will be available by varying the sliding short over a half guide wavelength to get the impedance match. Standing Wave Radio (SWR) is defined as:

$$SWR = \frac{1 + |\Gamma|}{1 - |\Gamma|} \quad (3)$$

where $\Gamma$ is reflection coefficient. A low SWR is obtained by spacing the two metered joints one-quarter of a guide wavelength apart at the desired frequency. The double wall water cooling for O-ring seals are arranged at gas inlet end and chamber end. This setup minimizes the etching of the tube, and maximizes the downstream concentration of reactants available for reaction with the substrate. In addition, the bypass gas inlet will be arranged for the activated gas and located in between the applicator and reactor in order to minimize etching of the tube.

IN SUMMARY

In summary, the present invention comprises a microwave discharge technique which can be used for etching and deposition in the vacuum processor reactors. It consists of: (1) a tunable microwave applicator which uses an adjustable short circuit to get the optimum coupling for the gas discharge; (2) a double wall water cooled conduit 18 which prevents the junction of the conduit sections from being burned under the high temperature, which is due to gas discharging, thus enhancing the reliability of the reactor; (3) a sapphire part of the tubing prevents chemical reaction with the reactive species of the activated gas, such as fluorine, further improving the particulate reduction in the reactor; and a circular waveguide part also has double wall water cooling on applicator to cool the tubing. The use of a pulsed microwave power source prevents the cracking of the sapphire tube because of the generation of high temperatures.

While only a single embodiment of this invention has been described, it will be apparent to persons skilled in the art that the invention is subject to various modifications and adaptations. It is intended, therefore, that the scope of the invention be limited only by the appended claims as read in the light of the prior art.

What is claimed is:

1. In a system for supplying a plasma to a vacuum process reactor, the combination comprising:
    a reactant gas conduit, said conduit having an inlet section, a center section and an outlet section, said inlet and outlet sections being comprised of water cooled double walls and being made of a quartz material, the center section of said conduit being made of a sapphire material which does not react to the reactive species of an activated reactant gas to be flowed through said sections;
    a reactant gas supplied to said inlet section and flowing through said conduit to said reactor;
    a source of pulsed microwave energy having a given wavelength;
    a coupling device coupling said source of microwave energy to the reactant gas in said center section of said conduit, said coupling device comprising an impedance matching device connected to said source and a tunable non-conducting circular waveguide extending from said impedance matching device to an axially adjustable short, said conduit extending transversely through said waveguide, the length of said waveguide from said impedance matching device to said short being ½ wavelength, a center axis of said conduit being located ¼ wavelength from said impedance matching device, and ¼ wavelength from said adjustable short, said waveguide having a water cooled double wall cylindrical jacket, said jacket having cylindrical extensions projecting transversely therefrom, sand the center section of said conduit being surrounded by said jacket;
    and means for axially adjusting the position of said short.

2. The system as defined in claim 1 wherein said waveguide is coupled to said matching impedance device at one of its ends, and an axially movable short at the other end, said short comprising a non-conducting cup-shaped member, said cup having a depth equal to ¼ wavelength.

3. The system as defined in claim 2 wherein the impedance matching device is a triple stub tuner.

* * * * *